United States Patent
Yano et al.

(10) Patent No.: US 7,096,402 B2
(45) Date of Patent: Aug. 22, 2006

(54) TURBO DECODER

(75) Inventors: Tetsuya Yano, Kawasaki (JP); Kazuhisa Obuchi, Kawasaki (JP); Kazuo Kawabata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 555 days.

(21) Appl. No.: 09/901,295

(22) Filed: Jul. 9, 2001

(65) Prior Publication Data

US 2001/0052099 A1    Dec. 13, 2001

Related U.S. Application Data

(63) Continuation of application No. PCT/JP99/00962, filed on Mar. 1, 1999.

(51) Int. Cl.
H03M 13/29 (2006.01)
H03M 13/45 (2006.01)

(52) U.S. Cl. .................. 714/755; 714/758; 714/780; 714/786; 714/788

(58) Field of Classification Search ............... 714/755, 714/794, 780, 758, 786, 788
See application file for complete search history.

(56) References Cited

U.S. PATENT DOCUMENTS

| | | | |
|---|---|---|---|
| 5,446,747 A | 8/1995 | Berrou .................. | 371/45 |
| 5,721,745 A | 2/1998 | Hladik et al. | |
| 5,761,248 A | 6/1998 | Hagenauer et al. ......... | 375/340 |
| 5,983,385 A * | 11/1999 | Khayrallah et al. ......... | 714/755 |
| 5,996,104 A * | 11/1999 | Herzberg ................... | 714/755 |
| 6,119,264 A * | 9/2000 | Berrou et al. ............... | 714/786 |
| 6,122,763 A * | 9/2000 | Pyndiah et al. ............. | 714/755 |
| 6,192,503 B1 * | 2/2001 | Chennakeshu et al. ..... | 714/796 |
| 6,233,709 B1 * | 5/2001 | Zhang et al. ............... | 714/774 |
| 6,292,918 B1 * | 9/2001 | Sindhushayana et al. ... | 714/755 |
| 6,304,985 B1 * | 10/2001 | Sindhushayana et al. ... | 714/702 |
| 6,304,995 B1 * | 10/2001 | Smith et al. ................ | 714/786 |
| 6,360,345 B1 * | 3/2002 | Kim et al. ................... | 714/746 |
| 6,366,624 B1 * | 4/2002 | Balachandran et al. ..... | 375/341 |
| 6,574,766 B1 | 6/2003 | Obuchi et al. | |
| 6,598,204 B1 | 7/2003 | Giese et al. | |
| 6,615,385 B1 | 9/2003 | Kim et al. | |

FOREIGN PATENT DOCUMENTS

| | | |
|---|---|---|
| EP | 1 009 098 | 6/2000 |
| JP | 62145934 | 6/1987 |

(Continued)

OTHER PUBLICATIONS

Hong, et al., "VLSI Design and Implementation of Low-Complexity Adaptive Turbo-Code Encoder and Decoder for Wireless Mobile Communications Applications" 1998 IEEE Workshop on Signal Processing Systems, Oct. 1998, pp. 233-242.*

(Continued)

Primary Examiner—Stephen M. Baker
(74) Attorney, Agent, or Firm—Katten Muchin Rosenman LLP

(57) ABSTRACT

Detection of errors in the results of turbo decoding is performed while decoding is being repeated. If absence of errors is detected, the results of decoding are output, even though repetition of the decoding operation is in progress, and further decoding is discontinued. Further, the number of times errors are detected in decoded results when decoding has been performed a set number of times is monitored and the decoding operation is executed again if the number of times errors are detected is equal to or less than a set value. Further, one of first and second decoded results output from first and second elementary decoders that construct a turbo decoder is selected as appropriate and is then output.

11 Claims, 17 Drawing Sheets

FOREIGN PATENT DOCUMENTS

| | | |
|---|---|---|
| JP | 62181530 | 8/1987 |
| JP | 2000-183758 | 6/2000 |
| JP | 2000-216689 | 8/2000 |
| JP | 2000-513555 | 10/2000 |
| JP | 2001-512914 | 8/2001 |
| JP | 2001-516175 | 9/2001 |
| JP | 2002-529953 | 9/2002 |
| JP | 2002-534892 | 10/2002 |
| WO | 99/55008 | 10/1999 |
| WO | 00/27037 | 5/2000 |
| WO | WO 00/41312 | 7/2000 |

OTHER PUBLICATIONS

Hong, et al., "VLSI Design and Implementation of Low-Complexity Adaptive Turbo-Code Encoder and Decoder for Wireless Mobile Communications Applications" 1998 IEEE Workshop on Signal Processing Systems, Oct. 1998, pp. 233-242.*

Robertson, "Illuminating the Structure of Code and Decoder of Parallel Concatenated Recursive Systematic (Turbo) Codes", IEEE Global Telecommunications Conference, GLOBECOM '94, Dec. 1994, pp. 1298-1303.*

Jung et al.,"Comprehensive Comparison of Turbo-Code Decoders", IEEE 45th Vehicular Technology Conference, Jul. 1995, pp. 624-628.*

Narayanan et al., "A Novel ARQ Technique using the Turbo Coding Principle", IEEE Communications Letters, vol. 1, No. 2, Mar. 1997, pp. 49-51.*

Small World Communications. Iterative Decoding of Parallel Concatenated Convolutional Codes. Jan. 13, 1999 Version 1.4.

Technical Report of IEICE. Parallel Concatenated (Turbo) Coding, Turbo (Iterative) Decoding. Dec. 2, 1998.

U.S. Appl. No. 60/116,765, filed Jan. 22, 1999, Somayazulu.

U.S. Appl. No. 09/363,303, filed Jul. 28, 1999, Somayazulu.

Supplementary European Search Report dated Sep. 6, 2005.

Rose Y. Shao et al. Two Simple Stopping Criteria for Iterative Decoding. Information Theory Aug. 16, 1998, p. 279, XP010297151.

Joachim Hagenauer et al. Iterative Decoding of Binary Block and Convolutional Codes. IEEE Transactions on Information Theory vol. 42, No. 2, Mar. 1996, pp. 429-445, XP000850507.

Japanese Office Action dated Mar. 28, 2006, 2006 for corresponding Japanese Application 2000-603156.

* cited by examiner

FIG. 8

TURBO DECODER

This application is a continuation of international application number PCTJP99/00962, filed Mar. 1, 1999.

TECHNICAL FIELD

This invention relates to a turbo decoder and, more particularly, to a turbo decoder for performing decoding using results obtained by decoding a received signal, subsequently repeating decoding a set number of times using results of decoding obtained successively, and outputting the decoded data.

BACKGROUND ART

Error correction codes, which are for the purpose of correcting error contained in received information or in reconstructed information so that the original information can be decoded correctly, are applied to a variety of systems. For example, error correction codes are applied in cases where data is to be transmitted without error when performing mobile communication, FAX or other data communication, and in cases where data is to be reconstructed without error from a large-capacity storage medium such as a magnetic disk or CD.

Among the available error correction codes, it has been decided to adopt turbo codes (see the specification of U.S. Pat. No. 5,446,747) for standardization in next-generation mobile communications. FIG. 14 is a block diagram of a communication system that includes a turbo encoder and a turbo decoder. Numeral 11 denotes the turbo encoder, which is provided on the data transmitting side, and numeral 12 denotes the turbo decoder, which is provided on the data receiving side. Numeral 13 denotes a data communication path. Further, character u represents transmit information data of length N; xa, xb, xc represent encoded data obtained by encoding the information data u by the turbo encoder 11; ya, yb, yc denote received signals that have been influenced by noise and fading as a result of propagation of the encoded data xa, xb, xc through the communication path 13; and u' represents results of decoding obtained by decoding the received data ya, yb, yc by the turbo decoder 12. These items of data are as expressed below. It should be noted that decoded results u' include "results of decisions" and "likelihood".

Original data: $u = \{u1, u2, u3, \ldots, U_N\}$
Encoded data: $xa = \{x_{a1}, x_{a2}, x_{a3}, \ldots, x_{ak}, \ldots, x_{aN}\}$
: $xb = \{x_{b1}, x_{b2}, x_{b3}, \ldots, x_{bk}, \ldots, x_{bN}\}$
: $xc = \{x_{c1}, x_{c2}, x_{c3}, \ldots, x_{ck}, \ldots, x_{cN}\}$
Receive data: $ya = \{y_{a1}, y_{a2}, y_{a3}, \ldots, y_{ak}, \ldots, y_{aN}\}$
: $yb = \{y_{b1}, y_{b2}, y_{b3}, \ldots, y_{bk}, \ldots, y_{bN}\}$
: $yc = \{y_{c1}, y_{c2}, y_{c3}, \ldots, y_{ck}, \ldots, y_{cN}\}$ The turbo encoder 11 encodes the information data u of information length N and outputs the encoded data xa, xb, xc. The encoded data xa is the information data u per se, the encoded data xb is data obtained by the convolutional encoding of the information data u by an encoder ENC1, and the encoded data xc is data obtained by the interleaving (π) of the information data u and convolutional encoding of the interleaved results $x_a'$ by an encoder ENC2. In other words, a turbo code is obtained by combining two convolutional codes. It should be noted that an interleaved output xa' differs from the encoded data xa only in terms of its sequence and therefore is not output.

FIG. 15 is a diagram showing the details of the turbo encoder 11. Numerals 11a, 11b denote convolutional encoders (ENC1, ENC2) that are identically constructed, and numeral 11c denotes an interleaving unit (π). The convolutional encoders 11a, 11b, which are adapted to output recursive systematic convolutional codes, are each constructed by connecting two flip-flops FF1, FF2 and three exclusive-OR gates EXOR1~EXOR3 in the manner illustrated. The flip-flops FF1, FF2 take on four states (00), (01), (10), (1,1). If 0 or 1 is input in each of these states, the states undergo a transition as illustrated in FIG. 16 and the encoder ENC1 outputs xa, xb. In FIG. 16, the left side indicates the state prior to input of receive data, the right side the state after the input, the solid lines the path of the state transition when "0" is input and the dashed lines the path of the state transition when "1" is input, and 00, 11, 10, 01 on the paths indicate the values of the output signals xa, xb. By way of example, if "0" is input in the state 0(00), the output is 00 and the state becomes 0(00); if "1" is input, the output is 11 and the state becomes 1(10).

FIG. 17 is a block diagram of the turbo decoder. Turbo decoding is performed by a first elementary decoder (DEC1) 12a using ya and yb first among the received signals ya, yb, yc. The elementary decoder 12a is a soft-output elementary decoder and outputs the likelihood of decoded results. Next, similar decoding is performed by a second elementary decoder (DEC2) 12b using the likelihood, which is output from the first elementary decoder 12a, and yc. That is, the second elementary decoder 12b also is a soft-output elementary decoder and outputs the likelihood of decoded results. Here yc is a received signal corresponding to xc, which was obtained by interleaving the information data u and encoding the interleaved results. Accordingly, the likelihood that is output from the first elementary decoder 12a is interleaved by an interleaver (π) 12c before it enters the second elementary decoder DEC2.

The likelihood output from the second elementary decoder 12b is deinterleaved by a deinterleaver ($\pi^{-1}$) 12d and then is fed back as the input to the first elementary decoder 12a. Further, u' is decoded data (results of decoding) obtained by rendering a "0", "1" decision regarding the deinterleaved results from the second elementary decoder 12b. Error rate is reduced by repeating the above-described decoding operation a prescribed number of times.

With turbo decoding, errors in results of decoding decline whenever decoding processing is repeated. However, there are instances where the number of repetitions needed to eliminate errors in decoded results varies depending upon the state of the communication path, etc. As a consequence, if data is decoded correctly with a small number of repetitions, from this point onward the turbo decoder repeats unnecessary decoding operations until a set number of operations is executed.

Further, with turbo decoding, errors in results of decoding decline whenever decoding processing is repeated. However, there are cases where not all errors are corrected and errors remain even though decoding processing is executed the set number of times. In such cases there are instances where error is reduced considerably and if decoding processing is executed one more time, there is a good possibility that all errors will be corrected. With the conventional turbo decoder, decoded results containing error are output as is, without taking the above-mentioned possibility into account, when decoding has been performed the set number of times.

Further in the conventional turbo decoder, the first and second elementary decoders 12a, 12b execute first and second decoding processes with regard to a combination of different received signals. The decoding operations, however, are exactly the same. Accordingly, there is the possibility that one elementary decoder can be used for both the first and second decoding processes. With the prior art, however, the arrangement is such that two, i.e., the first and second, elementary decoders are used for the first and second decoding processes. This results in a large amount of hardware. A problem arises also in terms of power consumption.

As shown in FIG. 17, the output of the turbo decoder is the result of deinterleaving the output of the second elementary decoder 12b. As a result, if errors remain in the decoded data, the errors are randomized by deinterleaving. As shown in (a) of FIG. 18, there are many cases where the units of the turbo code are very long, and in such cases a single unit of turbo code includes a plurality of information blocks. If errors are randomized by deinterleaving in such cases, the errors are dispersed over a plurality of information blocks, as shown at (b) of FIG. 18, the error rate on a per-information-block basis increases and, if resend control is carried out in units of the information blocks, a problem that arises is an increase in number of resends.

Further, in next-generation mobile communications, information transmitted will be a mix of information of various properties and, depending upon the type of data transmitted, there will be instances where it would be better for the error patterns in the decoded data to be bursty and instances where it would be better for the error patterns to be random. With the conventional turbo decoder, however, error patterns contained in the decoded data that is output cannot be make bursty or random as necessary.

Accordingly, an object of the present invention is to so arrange it that if all errors have been corrected before the number of repetitions of decoding attains a set number, the results of decoding are output immediately and the decoding operation is halted.

Another object of the present invention is to so arrange it that when there is a possibility that all errors will be corrected if decoding processing is executed one more time in an instance where all errors have not been not corrected and a prescribed number of errors remain despite the fact that decoding processing has been executed a set number of times, the decoding operation will not be halted and will be executed one more time.

A further object of the present invention is to make it possible to use one elementary decoder for both the first and second decoding processes of the prior art.

Still another object of the present invention is to so arrange it that an error generation pattern contained in decoded data is rendered bursty.

Still another object of the present invention is to so arrange it that an error pattern contained in decoded data to be output can be made bursty or random as necessary.

DISCLOSURE OF THE INVENTION

Detection of errors in the results of turbo decoding is performed while decoding is being repeated. If absence of errors is detected, the results of decoding are output even though repetition of the decoding operation is in progress, then decoding is discontinued. If this arrangement is adopted, decoding time can be shortened and the power consumed by the circuitry can be reduced.

The number of times errors are detected in decoded results when decoding has been performed a set number of times is monitored and the decoding operation is executed again if the number of times errors are detected is equal to or less than a set value. If this arrangement is adopted, the decoding operation is performed one more time in instances where even though errors remain at the end of the set number of decoding operations, the number of errors is small and there is the possibility that all errors will be corrected if decoding processing is executed one more time. This makes it possible to output results of decoding in a state in which all errors have been corrected.

First and second decoding processes that were executed by first and second elementary decoders are caused to be executed by a single elementary decoder, received signals used in each of the decoding processes are selected in conformity with the timings at which the first and second decoding processes are executed, and the selected signals are input to the elementary decoder. If this arrangement is adopted, hardware can be reduced and so can power consumption.

In a turbo decoder having two, namely first and second, elementary decoders, a received signal input to the first elementary decoder and a received signal input to the second elementary decoder have their order reversed with respect to the prior art so that the pattern of generated error contained in a decoded signal is made bursty. If this arrangement is adopted, error rate on a per-information-block basis can be reduced and so can the number of resends.

In a turbo decoder in which first and second decoding processes were executed by first and second elementary decoders are caused to be executed by a single elementary decoder, the order of a received signal input to the elementary decoder at the time of the first decoding process and a received signal input to the elementary decoder at the time of the second decoding process is reversed with respect to the prior art. By adopting this arrangement, the pattern of generated error contained in an output decoded signal can be made bursty, error rate on a per-information-block basis can be reduced and so can the number of resends. The amount of hardware can be reduced as well.

It is so arranged that one of first and second decoded results output from first and second elementary decoders that construct a turbo decoder is selected as appropriate and is then output. If this arrangement is adopted, the generation of an error pattern in decoded data can be made bursty or random as necessary. For example, if an error correction circuit is located downstream, the generation of an error pattern in decoded data can be made random and error correction can be performed by the error correction circuit. If a function for resending an erroneous block is available, the generation of an error pattern in the decoded data can be made bursty and the number of resends can be reduced.

In a turbo decoder in which first and second decoding processes were executed by first and second elementary decoders are caused to be executed by a single elementary decoder, a combination of received signals input to the elementary decoder is selected at the timing at which the first decoding process is executed, and a received signal input to the elementary decoder is selected at a timing at which the second decoding process is executed, whereby the generation of an error pattern in decoded data can be made bursty or random as necessary. In this case, one elementary decoder can be used as two elementary decoders, as a result of which the scale of the circuitry can be reduced.

BRIEF DESCRIPTION OF THE DRAWINGS

FIG. 8 is a diagram useful in describing patterns of error generation;

BEST MODE FOR CARRYING OUT THE INVENTION (a) FIRST EMBODIMENT

Figure 1:
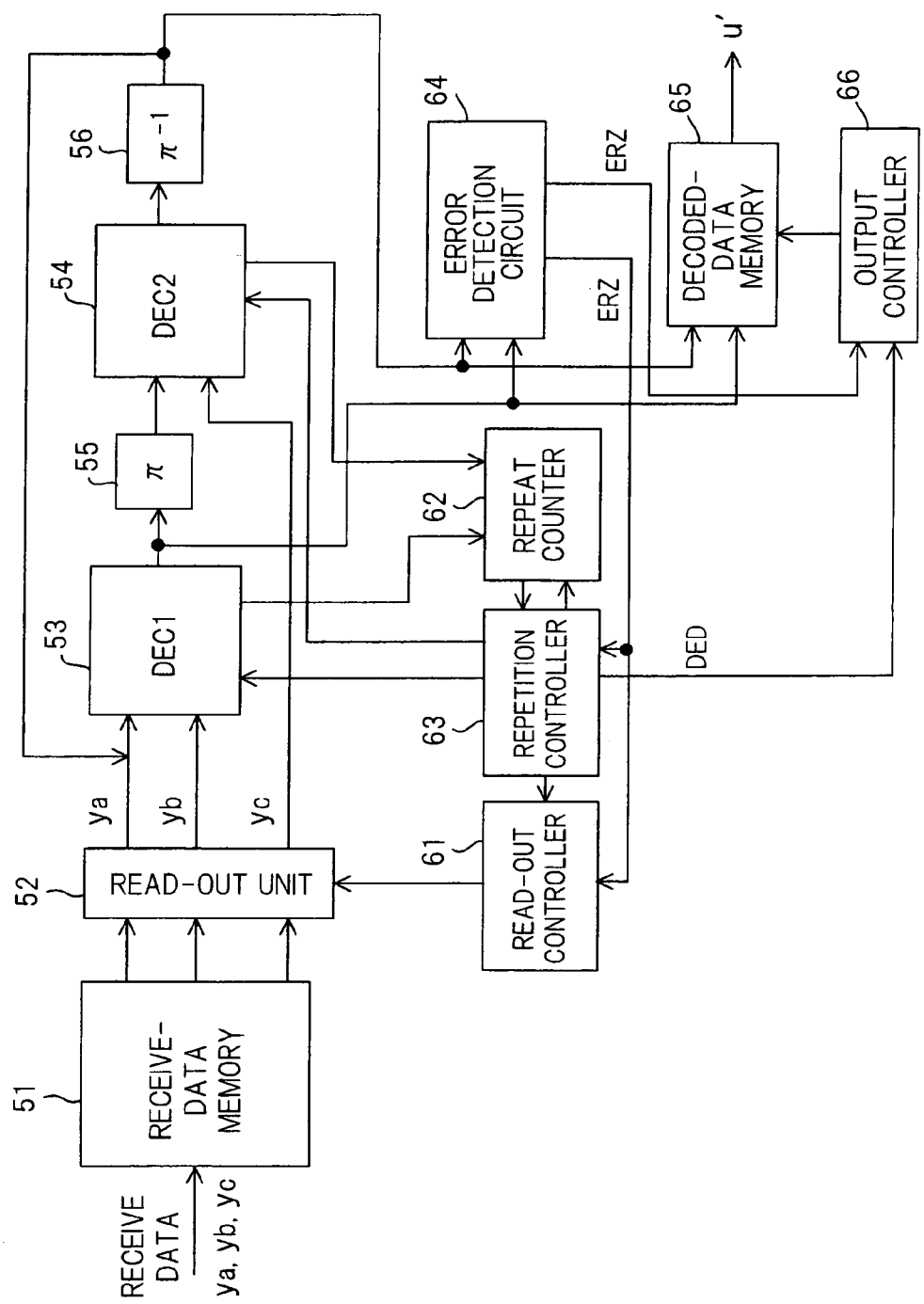
FIG. 1 is a block diagram of a first embodiment of a turbo decoder according to the present invention.

FIG. 1 is a block diagram of a turbo decoder according to a first embodiment of the present invention, in which ya, yb, yc denote received signals that have been influenced by noise and fading as a result of propagation, through a communication path, of encoded data xa, xb, xc that have been output from a turbo encoder on the transmitting side. The encoded data xa is the information data u per se, the encoded data xb is data obtained by the convolutional encoding of the information data u, and the encoded data xc is data obtained by the interleaving of the information data u and subsequent convolutional encoding of the interleaved results.

A receive-data memory 51 stores all of the received signals ya, yb, yc in units of the turbo code, and a read-out unit 52 reads the received data ya, yb, yc out of the memory at a suitable timing and inputs the data to first and second elementary decoders (DEC1, DEC2) 53, 54. The first and second elementary decoders 53, 54, which execute decoding processing in accordance with the well-known MAP (Maximum A Posteriori Probability) decoding algorithm, are soft-decision-input/soft-decision-output decoders.

The first elementary decoder 53 performs a MAP decoding operation using the received signals ya, yb and outputs the likelihood of results of decoding (this operation represents the first half of turbo decoding). Next, the second elementary decoder 54 performs a similar MAP decoding operation using the received signal yc and the likelihood output from the first elementary decoder 53 and outputs the likelihood of results of decoding (this operation represents the second half of turbo decoding). Since the received signal yc is a received signal corresponding to the encoded data xc, which was obtained by interleaving the information data u and encoding the interleaved results, an interleaver ($\pi$) 55 interleaves the likelihood output from the first elementary decoder 53 and inputs the results to the second elementary decoder 54. A deinterleaver ($\pi^{-1}$) 56 deinterleaves the likelihood output from the second elementary decoder 54 and feeds it back to the first elementary decoder 53. This completes one cycle of turbo decoding. By subsequently repeating the foregoing decoding operation a prescribed number of times, the error rate in the results of decoding is reduced.

A read-out controller 61 controls the read-out unit 52 to read the received signals ya, yb, yc out of the memory 51 and inputs these signals to the first and second elementary decoders 53, 54 in conformity with the decoding processing timing thereof. Further, (1) when a set number of decoding operations have been completed with regard to a received signal of interest and (2) when the results of decoding no longer contain errors even though the number of repetitions of decoding is less than the set number, the read-out controller 61 controls read-out of the read-out unit 52 for the purpose of starting decoding of the next new received signal.

A repeat counter 62 is counted up whenever the first and second elementary decoders 53, 54 complete the first and second halves, respectively, of the decoding operation and inputs these counts to a repetition controller 63.

The repetition controller 63 causes the elementary decoders 53, 54 to execute their decoding operations repeatedly. If the number of repetitions attains the set number, the repetition controller 63 notifies the read-out controller 61 and an output controller 66 (i.e., outputs a decoding-end signal DED). Further, when results of decoding no longer contain errors, the repetition controller 63 halts the decoding operation and clears the count in the repeat counter 62 to zero in response to a signal ERZ output from an error detection circuit 64.

The error detection circuit 64 performs an error detecting operation using first results of decoding output from the first elementary decoder 53 and second results of decoding output from the deinterleaver 56. Since decoded data of information length N is composed of a number of information blocks and an error detection code such as a CRC code has been added onto each information block, the error detection circuit 64 performs error detection using this error detection code and outputs the error-zero signal ERZ when errors are no longer detected in any of the information blocks.

A decoded-data memory 65 alternately stores the results of decoding output from the first elementary decoder 53 and the second results of decoding output from the deinterleaver 56. Upon receiving the signal DED from the repetition controller 63 indicating the end of the set number of decoding operations or the error-zero signal ERZ from the error detection circuit 64, the output controller 66 outputs the results of decoding that have been stored in the decoded-data memory 65

Thus, errors in results of decoding are detected by the error detection circuit 64 in parallel with the decoding operation. If errors remain even though decoding is performed, the first and second elementary decoders 53, 54 carry out their decoding operations the set number of times and the output controller 66 subsequently outputs the results of decoding in response to generation of the decoding-end signal DED. However, if errors are eliminated from the results of decoding before the number of decoding operations attains the set number, the output controller 66 outputs the results of decoding and the repetition controller 63 discontinues the decoding operation in response to the error-zero signal ERZ even though repetition of the decoding operation is in progress. If this arrangement is adopted, decoding time can be shortened and consumption of power by the circuitry can be reduced.

(b) MODIFICATION OF FIRST EMBODIMENT

Figure 2:
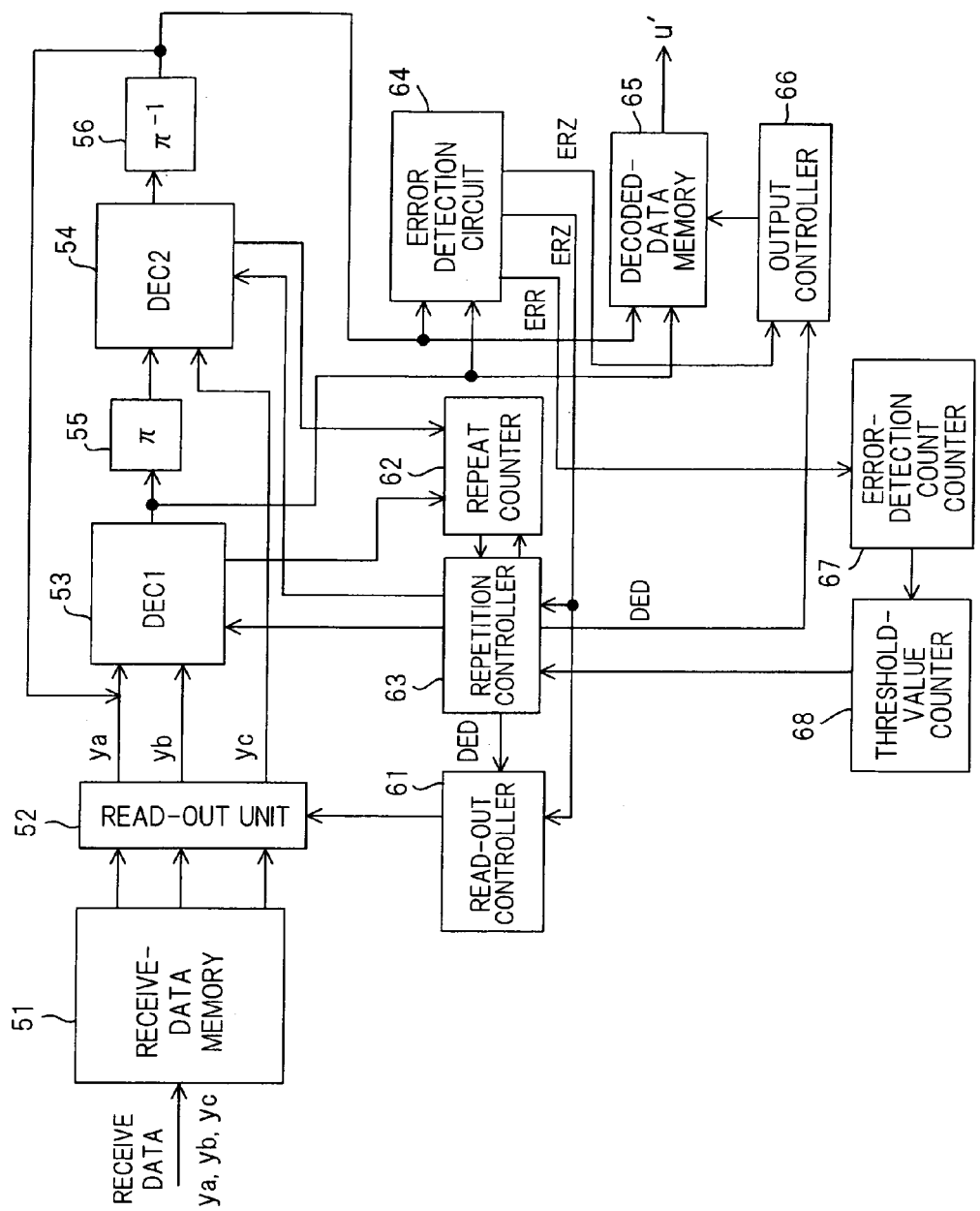
FIG. 2 illustrates a modification of the first embodiment of the turbo decoder according to the present invention.

The turbo decoder according to the first embodiment terminates the decoding operation and outputs the results of decoding prevailing at this time upon performing decoding the set number of times if errors have not been eliminated. However, there are instances where even though errors remain at the end of the set number of decoding operations, the number of errors is small and there is the possibility that all errors will be corrected if decoding processing is executed one more time. In such instances it is advantageous to perform the decoding operation one more time and output results of decoding that are error free. To accomplish this, a modification shown in FIG. 2 additionally provides the arrangement of the first embodiment with an error-detection count counter 67 and a threshold-value decision unit 68. The error detection circuit 64 outputs an error-detection signal ERR whenever an error is detected. The error-detection count counter 67, therefore, counts the signal ERR to thereby monitor the number of times errors have been detected in the results of decoding of the set number of decoding operations. The threshold-value decision unit 68 compares a threshold value with the number of times errors have been detected in the results of decoding of the set number of decoding operations and, if the number of error detections is equal to or less than the threshold value, so notifies the repetition controller 63.

If the number of error detections is greater than the threshold value, the repetition controller 63 halts the decoding operation and outputs the decoding-end signal DED to the read-out controller 61 and output controller 66. As a result, the output controller 66 outputs the results of decoding and the read-out controller 61 starts control for reading out the next new received signal.

If the number of error detections is equal to or less than the threshold value, on the other hand, then the repetition controller 63 does not halt the decoding operation and does not output the decoding-end signal DED to the read-out controller 61 and output controller 66. As a result, the decoding operation is performed one more time. The repetition controller 63 thenceforth outputs the decoding-end signal DED to the read-out controller 61 and output controller 66 irrespective of whether the number of error detections is greater than or less than the threshold value. As a result, the output controller 66 outputs the results of decoding and the read-out controller 61 controls the read-out of the next new received signal.

If this arrangement is adopted, the decoding operation is performed one more time in instances where even though errors remain at the end of the set number of decoding operations, the number of errors is small and there is the possibility that all errors will be corrected if decoding processing is executed one more time. This makes it possible to output results of decoding in a state in which all errors have been corrected.

(c) SECOND EMBODIMENT

Figure 3:
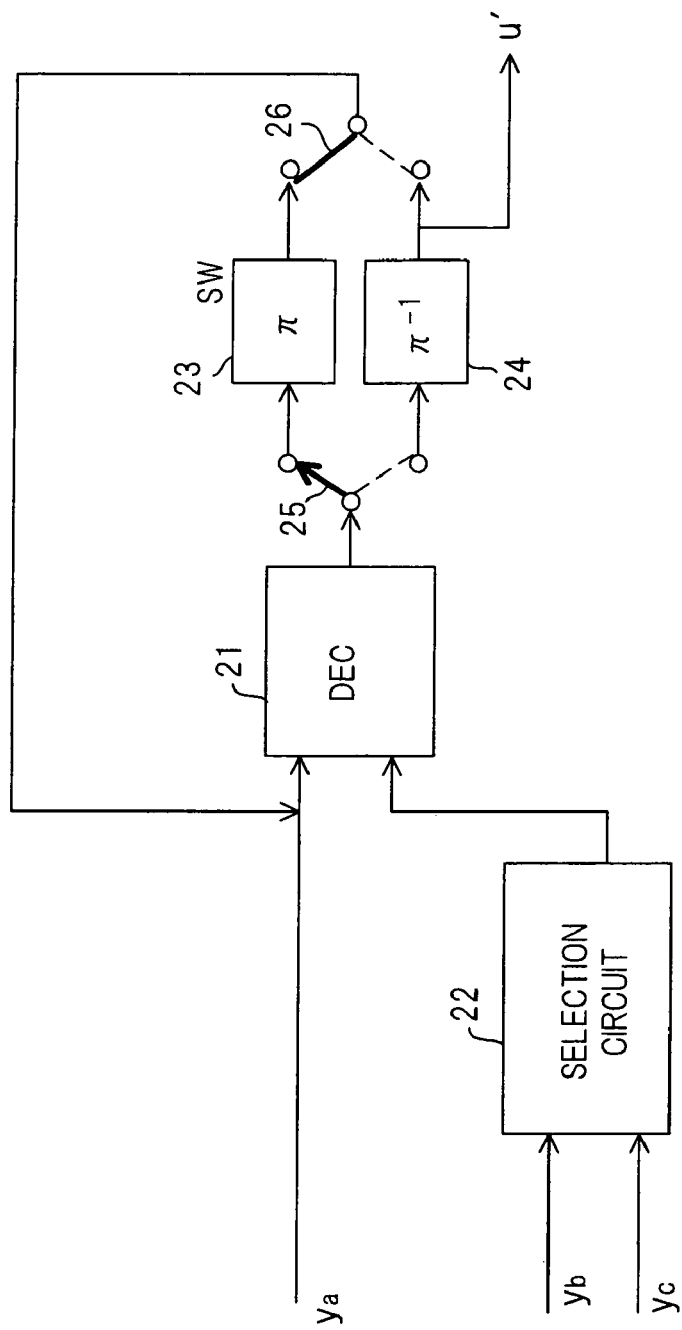
FIG. 3 is a block diagram illustrating a second turbo decoder of the present invention in which use is made of a common elementary decoder.

FIG. 3 shows an embodiment of turbo decoder in which a single elementary decoder is adopted.

Here an elementary decoder 21 executes, in time-shared fashion, (1) the decoding processing (first half of decoding processing) that was performed by the first elementary decoder 53 of FIG. 1 using the received signals ya, yb and the results of the second half of decoding, and (2) the decoding processing (second half of decoding processing) that was performed by the second elementary decoder 54 of FIG. 1 using the received signal yc and the results of the first half of decoding. In other words, the timing of the decoding operation is divided into a first timing at which first (first half) decoding processing is executed and a second timing at which second (second half) decoding processing is executed, the first half of decoding processing is executed at the first timing and the second half of decoding processing is executed at the second timing.

A selection circuit 22 selects, and inputs to the elementary decoder 21, the received signal yb at the first timing at which the first half of decoding processing is executed, and selects, and inputs to the elementary decoder 21, the received signal yc at the second timing at which the second half of decoding processing is executed. An interleaver 23 interleaves the first half of the results of decoding and feeds back the results to the input side of the elementary decoder 21, and a deinterleaver 24 deinterleaves the second half of the results of decoding and feeds back the results to the input side of the elementary decoder 21. Switches 25, 26 perform switching so as to input the first and second halves of the results of decoding to the interleaver 23 and deinterleaver 24, respectively, and to feed back the signals to the input side of the elementary decoder 21.

In terms of the overall operation, the selection circuit 22 inputs the received signal yb to the elementary decoder 21 at the first timing and the switches 25, 26 are switched to the states indicated by the solid lines in the drawing. The elementary decoder 21 performs the MAP decoding operation using the received signals ya, yb, thereby outputting the likelihood of the results of decoding (this operation represents the first half of turbo decoding). The interleaver 23 interleaves the likelihood output from the elementary decoder 21 and feeds back the results to the input of the elementary decoder 21. Next, when the second timing arrives, the selection circuit 22 inputs the received signal yc to the elementary decoder 21 and the switches 25, 26 are changed over to the states indicated by the dashed lines in the drawings.

The elementary decoder 21 performs the MAP decoding operation using the first half of the results of decoding (likelihood) and the received signals yc thereby outputting the likelihood of the results of decoding (this operation represents the second half of turbo decoding). The deinterleaver ($\pi^{-1}$) 24 deinterleaves the likelihood output from the elementary decoder 21 and feeds back the results to the elementary decoder 21.

This completes one cycle of turbo decoding. By repeating the above-described decoding operation a prescribed number of times, error rate in the results of decoding is reduced. After the decoding operation is carried out the prescribed number of times, the output of the deinterleaver 24 is delivered as the decoded results u' at the second timing.

If this arrangement is adopted, the number of elementary decoders can be made one, allowing the amount of hardware to be reduced.

(d) THIRD EMBODIMENT

Figure 18:
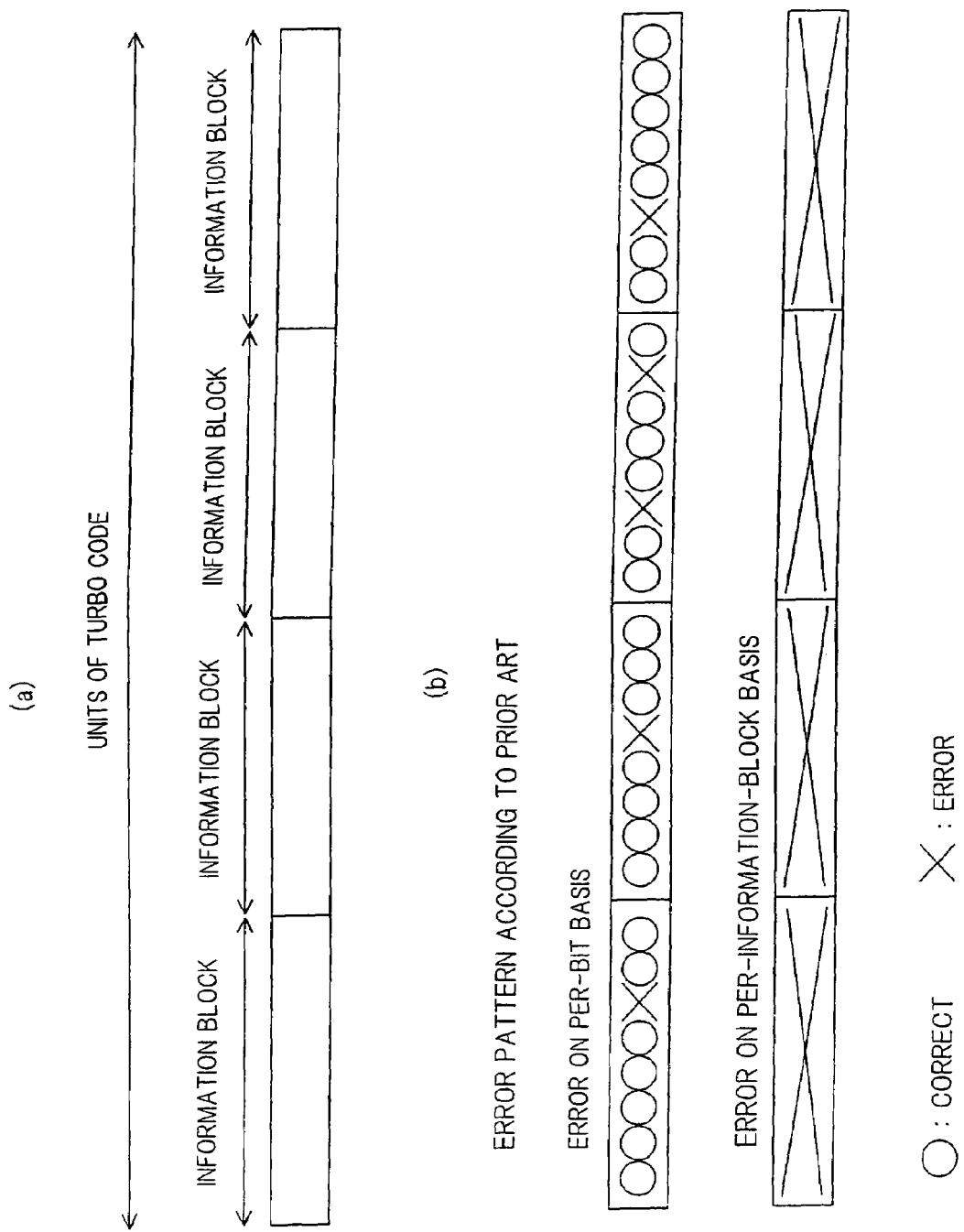
FIG. 18 is a diagram useful in describing units of turbo code and error patterns contained in the results of decoding by a conventional turbo decoder.

In the prior art, as shown in (b) of FIG. 18, errors are dispersed over a plurality of information blocks, the error rate on a per-information-block basis increases and, if resend control is carried out in units of the information blocks, this results in an increase in number of resends. In a case where resend control is carried out, therefore, it is more advantageous for errors to be concentrated rather than dispersed. With convolutional encoding, the error pattern in the results of decoding by an elementary decoder is bursty in nature. This property is utilized to make it possible to output results of decoding directly without the intervention of interleaving or deinterleaving.

Figure 4:
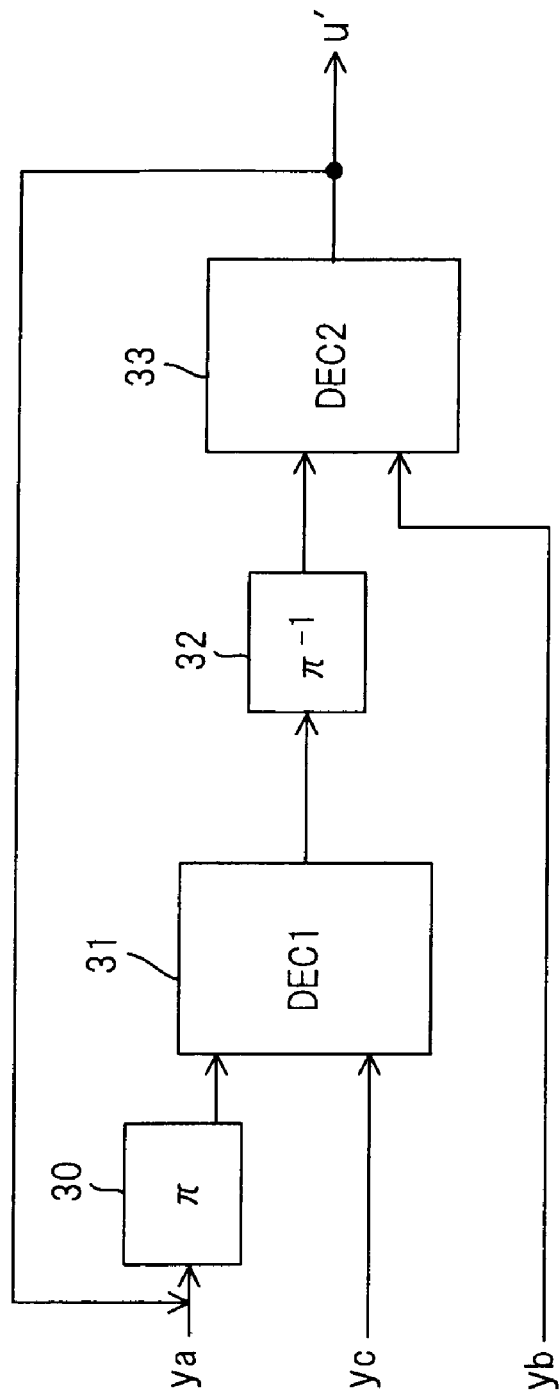
FIG. 4 is a block diagram of a third embodiment of a turbo decoder (which renders the generation of errors bursty) according to the present invention.

FIG. 4 is a block diagram showing a third embodiment of the present invention, in which an error generation pattern contained in results of decoding (decoded data) is rendered bursty.

An interleaver 30 interleaves the received signal ya and inputs the results to a first elementary decoder 31. The first elementary decoder 31 applies the MAP decoding operation to the received signals ya, yc and outputs the likelihood of the results of decoding. A deinterleaver 32 deinterleaves the likelihood output by the first elementary decoder 31 and inputs the results to a second elementary decoder 33. The second elementary decoder 33 performs the MAP decoding operation using the interleaved results of decoding (likelihood) and the received signal yb, and outputs the results (likelihood) u' of decoding, which are input to the interleaver 30.

Figure 5:
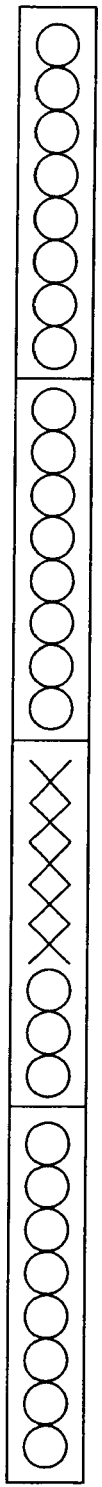
FIG. 5 is a diagram useful in describing a third embodiment.
Figure 5:
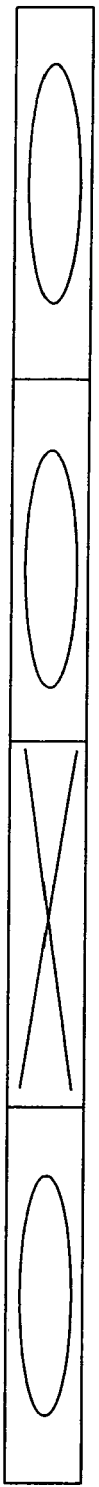

In the third embodiment, the received signals ya, yc are input to the first elementary decoder 31 and the received signal yb is input to the second elementary decoder 33, whereby the second half of the decoding processing in conventional turbo decoding is performed first and the first half of decoding processing is performed second. As a result, the output of the second elementary decoder 33 can be delivered as the results u' of decoding as is. With convolutional encoding, an error pattern contained in the results of decoding by an elementary decoder is rendered bursty, as described earlier. In accordance with the third embodiment, therefore, errors are concentrated, as shown in FIG. 5, error rate in units of the information blocks can be reduced and so can the number of resends.

(e) MODIFICATION OF THIRD EMBODIMENT

Figure 6:
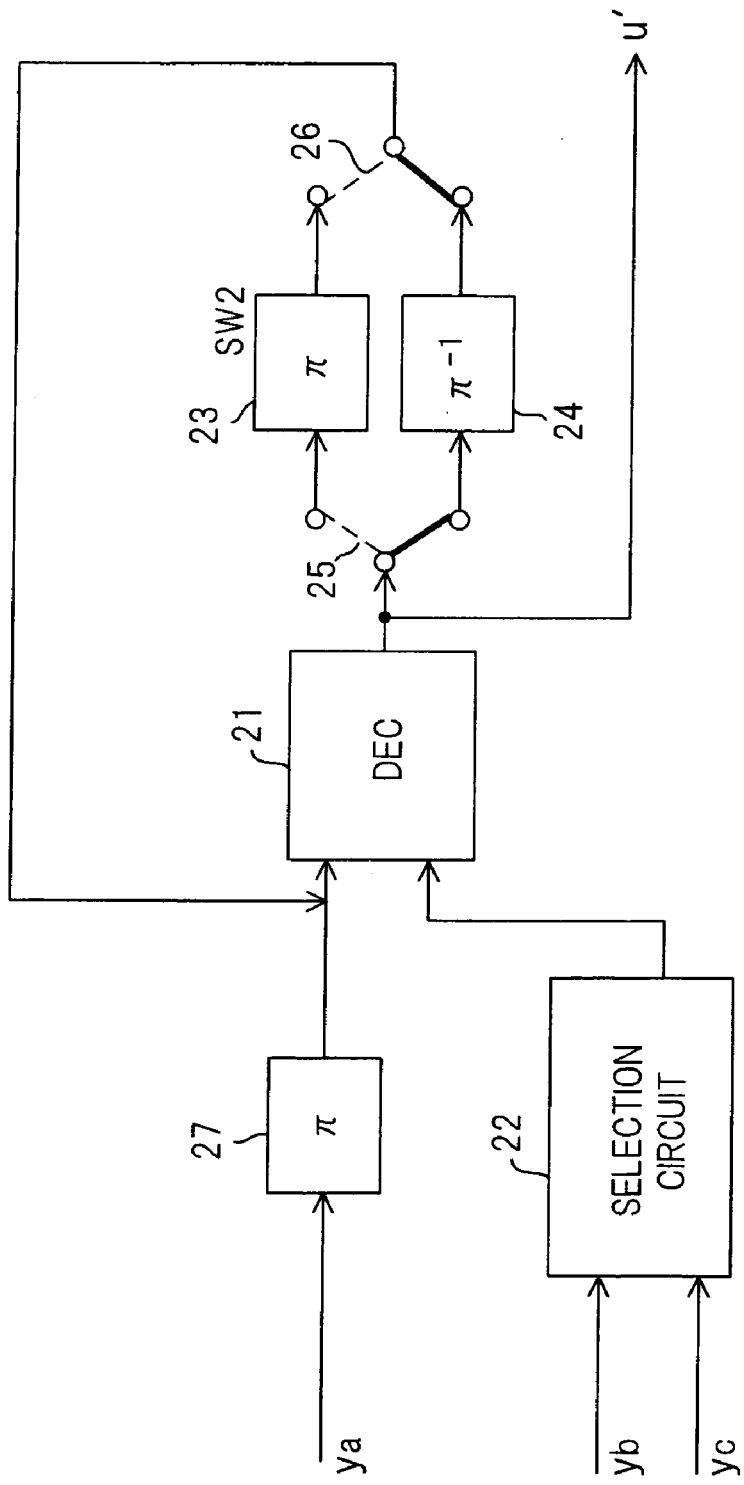
FIG. 6 is a block diagram illustrating another turbo decoder according to a third embodiment of the present invention.

In the third embodiment of FIG. 4, the error generation pattern contained in results of decoding is rendered bursty using the first and second elementary decoders. However, the error generation pattern contained in the results of decoding can be made bursty also in a case where the first and second decoding processes that where executed by the first and second elementary decoders are caused to be executed by a single elementary decoder. FIG. 6 shows such a modification of the third embodiment. Components of this modification identical with those of the second embodiment shown in FIG. 3 are designated by like reference characters.

This modification differs from the second embodiment of FIG. 3 in that (1) an interleaver 27 is provided for interleaving the received signal ya and inputting the results to the elementary decoder 21, (2) the selection circuit 22 inputs the received signal yc to the elementary decoder 21 at the first timing of the first half and inputs the received signal yb to the elementary decoder 21 at the second timing of the second half, (3) the switches 25, 26 input the output of the elementary decoder 21 to the deinterleaver 24 at the first timing, feed back the deinterleaved results to the input side of the elementary decoder 21, input the output of the elementary decoder 21 to the interleaver 23 at the second timing and feed back the interleaved results to the elementary decoder 21, and (4) the results u' of decoding are obtained from the output of the elementary decoder 21 directly and not from the output of the deinterleaver 24.

In terms of the overall operation, the selection circuit 22 inputs the received signal yc to the elementary decoder 21 at the first timing and the switches 25, 26 are switched to the states indicated by the solid lines in the drawing. The elementary decoder 21 performs the MAP decoding operation using the received signals ya, yc, thereby outputting the likelihood of the results of decoding. The deinterleaver 24 deinterleaves the likelihood output from the elementary decoder 21 and feeds back the results to the elementary decoder 21. Next, when the second timing arrives, the selection circuit 22 inputs the received signal yb to the elementary decoder 21 and the switches 25, 26 are changed over to the states indicated by the dashed lines in the drawings.

The elementary decoder 21 performs the MAP decoding operation using the first half of the results of decoding (likelihood) and the received signal yb, thereby outputting the likelihood of the results of decoding. The interleaver 23 interleaves the likelihood output from the elementary decoder 21 and feeds back the results to the elementary decoder 21.

By adopting this arrangement, the second half of the decoding processing in conventional turbo decoding is performed first and the first half of decoding processing is performed second, in a manner similar to that of the third embodiment, even though there is a single elementary decoder. As a result, the output of the elementary decoder 21 can be delivered as the results u' of decoding as is and the error pattern in the results of decoding can be rendered bursty. It should be noted that results of decoding are output as u' at the second timing.

Further, with the modification of FIG. 6, the amount of hardware can be reduced. Moreover, error rate in units of the information blocks can be reduced and so can the number of resends.

(f) FOURTH EMBODIMENT

If it is so arranged that one of the first and second results of decoding output from first and second elementary decoders constructing a turbo decoder can be selected and output, then the generation of the error pattern contained in decoded data can be rendered bursty or random as necessary. For example, in a case where an error correction circuit is located downstream, the generation of an error pattern in decoded data can be made random and error correction can be performed by the error correction circuit. In a case where a function for re-transmitting an erroneous block is available, the generation of an error pattern in the decoded data can be made bursty and the number of resends can be reduced.

Figure 7:
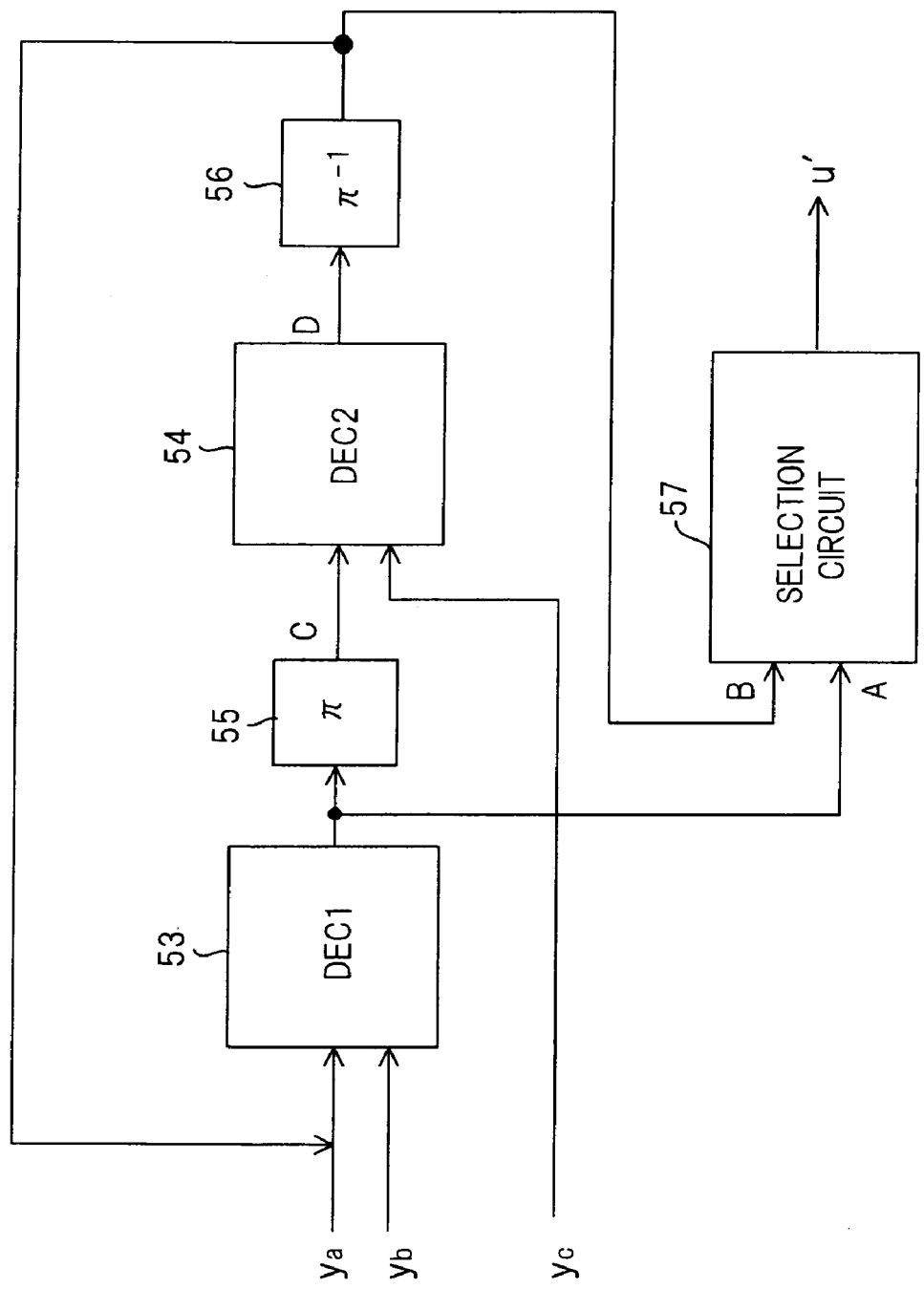
FIG. 7 is a block diagram of a fourth embodiment of a turbo decoder (of a type which selects results of decoding) according to the present invention.

FIG. 7 is a block diagram showing a fourth embodiment in which the generation of an error pattern contained in decoded data is made bursty or random. If the selection circuit is eliminated, the structure of this turbo decoder will be identical with that of the conventional turbo decoder.

Turbo decoding is performed by a first elementary decoder (DEC1) 53 using ya and yb first among the received signals ya, yb, yc. The elementary decoder 53 is a soft-output elementary decoder and outputs the decoded results (likelihood). Next, similar decoding is performed by a second elementary decoder 54 using the likelihood, which is output from the first elementary decoder 53, and received signal yc. That is, the second elementary decoder 54 also is a soft-output elementary decoder and outputs the decoded results (likelihood). The received signal yc is a received signal corresponding to xc, which was obtained by interleaving the information data u and encoding the interleaved results. Accordingly, the likelihood that is output from the first elementary decoder 53 is interleaved by an interleaver ($\pi$) 55 before it enters the second elementary decoder 54.

Figure 8:
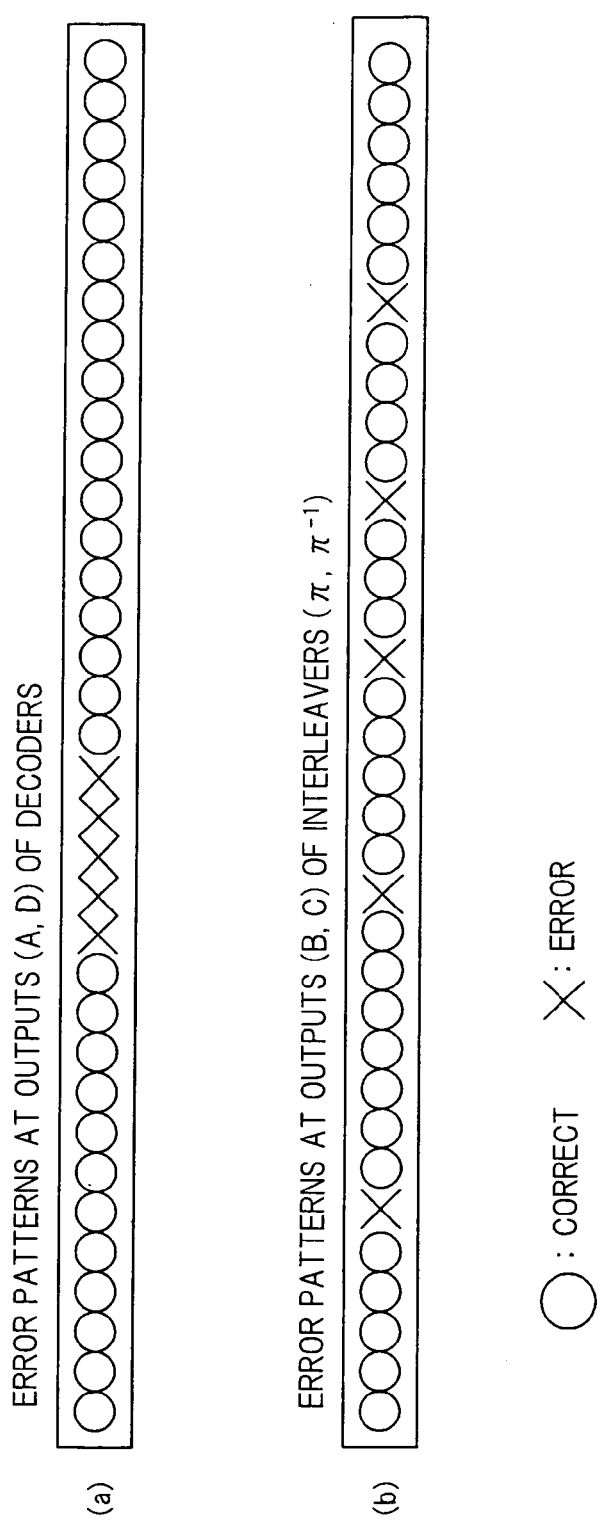

The likelihood output from the second elementary decoder 54 is deinterleaved by a deinterleaver ($\pi^{-1}$) 56 and then is fed back as the input to the first elementary decoder 53. A selection circuit 57 selects one of first decoded results A output from the first elementary decoder 53 and second decoded results B output from the deinterleaver 56. Since the first decoded results A are not subjected to either interleaving or deinterleaving, the pattern of generated error is rendered bursty, as shown at (a) of FIG. 8. On the other hand, the second decoded results B are deinterleaved with the decoded results from the second elementary decoder 54 and therefore the pattern of generated error is made random. Accordingly, by selecting and outputting one of the first and second decoded results A and B, the generation of an error pattern in decoded data can be rendered bursty or random as necessary.

It should be noted that since interleaving is performed between the first and second elementary decoders 53 and 54, the data output from the second elementary decoder 54 has an order that differs from that of the original information data. The results of decoding output from the second elementary decoder 54 therefore are deinterleaved to output the data upon restoring it to the original order. On the other hand, since the results of decoding from the first elementary decoder 53 have an order identical with that of the original information data, this data can be output as is without the order thereof being changed.

Thus, output of the first decoded results A or output of the second decoded results B is selected as the decoded data u' depending upon the nature of the transmitted data, thereby making it possible to improve the quality of data transmission.

Figure 9:
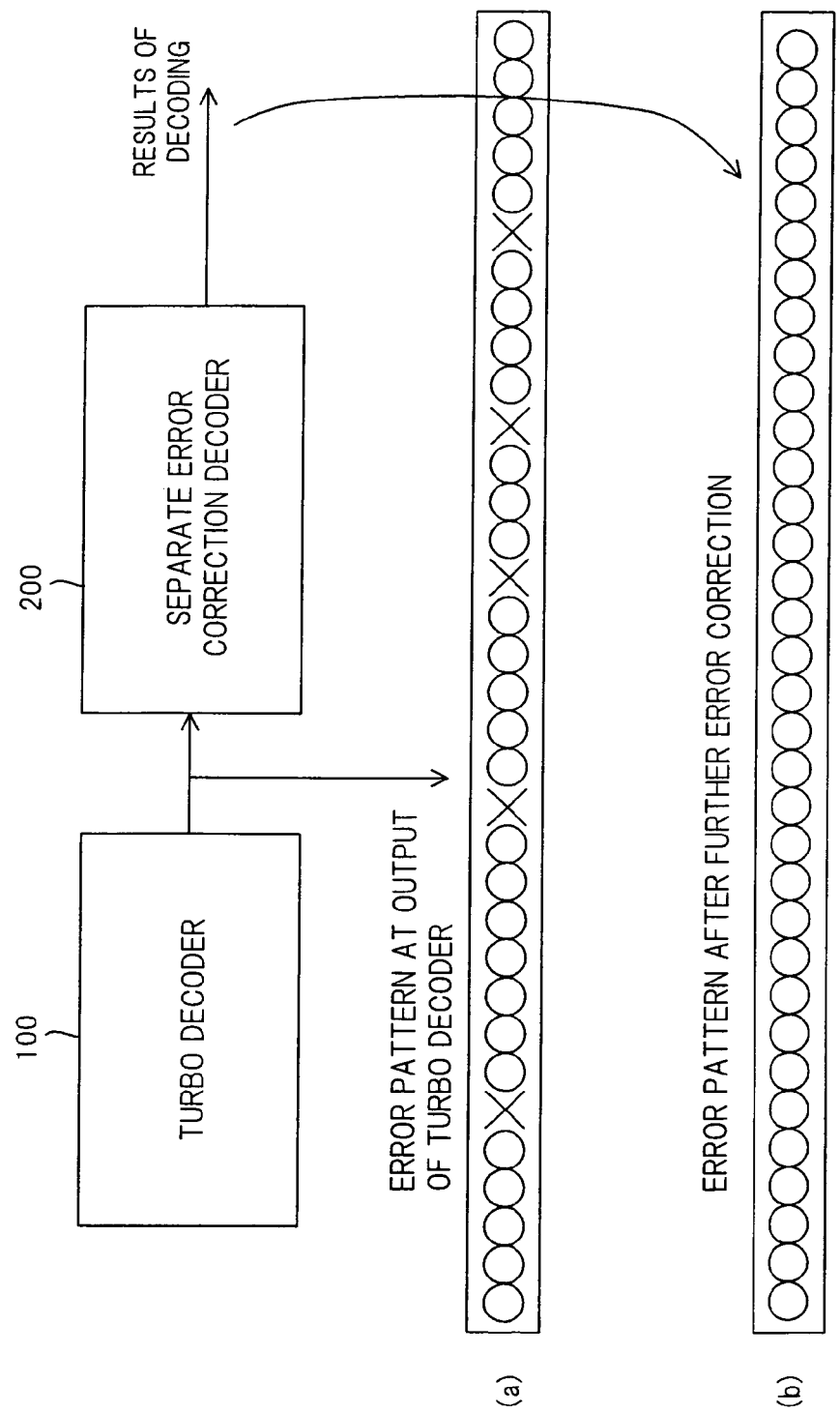
FIG. 9 is a diagram useful in describing a case where it is preferred that errors be random.

For example, in a case where the results of turbo decoding from a turbo decoder 100 are subjected to a further error correction by a separate error correction decoder 200, as shown in FIG. 9, the decoded results B, in which the pattern of error generation is randomized, is output. If this arrangement is adopted, erroneous bits contained in the results of decoding output from the turbo decoder 100 are dispersed, as shown at (a) in FIG. 9, and are capable of being corrected by the error correction decoder 200. After correction, the error correction efficiency can be improved, as indicated at (b). Outputting the decoded results B is suitable also in a case where a certain degree of random error is allowed, as when the data transmitted is voice or the like.

Figure 10:
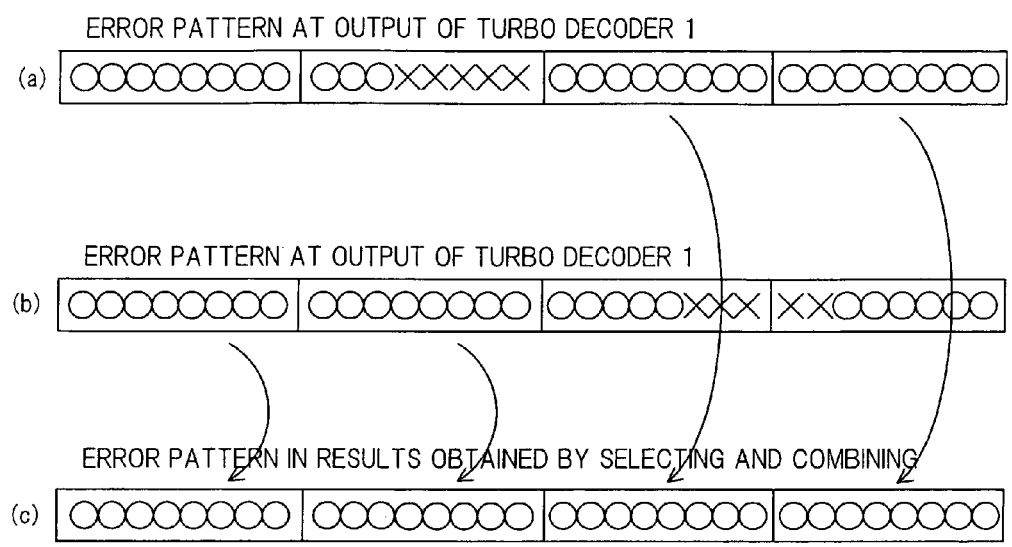
FIG. 10 is a diagram useful in describing selecting and combining of information blocks.
Figure 11:
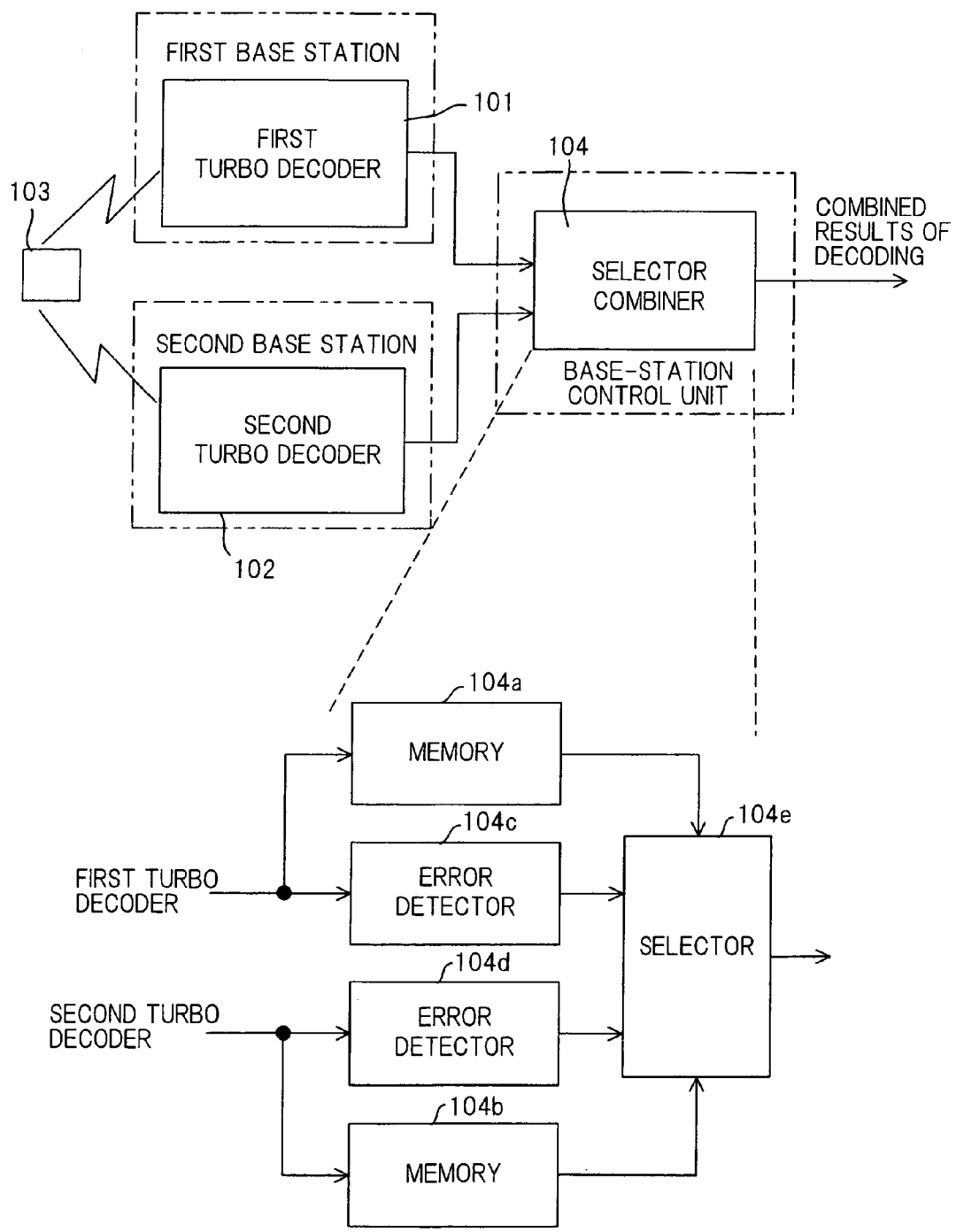
FIG. 11 shows an example of application of selecting and combining.

Further, if a plurality of information blocks are contained in turbo code units, as shown in FIG. 10, error-free information blocks are selected on a per-information-block basis from information blocks (a), (b) output from two turbo decoders and results (c) of combining the selected blocks are output, then the decoded results A are output. FIG. 11 shows an example of selecting and combining. Numeral 101 denotes a turbo decoder provided at a base station, 102 a turbo decoder provided at another base station, 103 a mobile unit, and 104 a selector combiner provided in a mobile exchange or base-station control unit. The selector combiner 104 has a site diversity function for selecting excellent information blocks. If the mobile unit 103 is situated near the zone boundary of a neighboring base station, the first and second base stations received signals from the mobile unit 103, subject the signals to turbo decoding and input the decoded signals to the mobile exchange. The selector combiner 104 in the mobile exchange selects error-free blocks on a per-information-block basis, as shown in FIG. 10, and executes processing based upon the selected and combined results.

The selector combiner 104 is constituted by memories 104a, 104b for storing results of decoded that enter from the first and second turbo decoders 101, 102, error detection circuits 104c, 104d for detecting errors in each of the decoded results, and a selector 104e for selecting and outputting error-free information blocks based upon the results of error detection.

(g) MODIFICATION OF FOURTH EMBODIMENT

Figure 12:
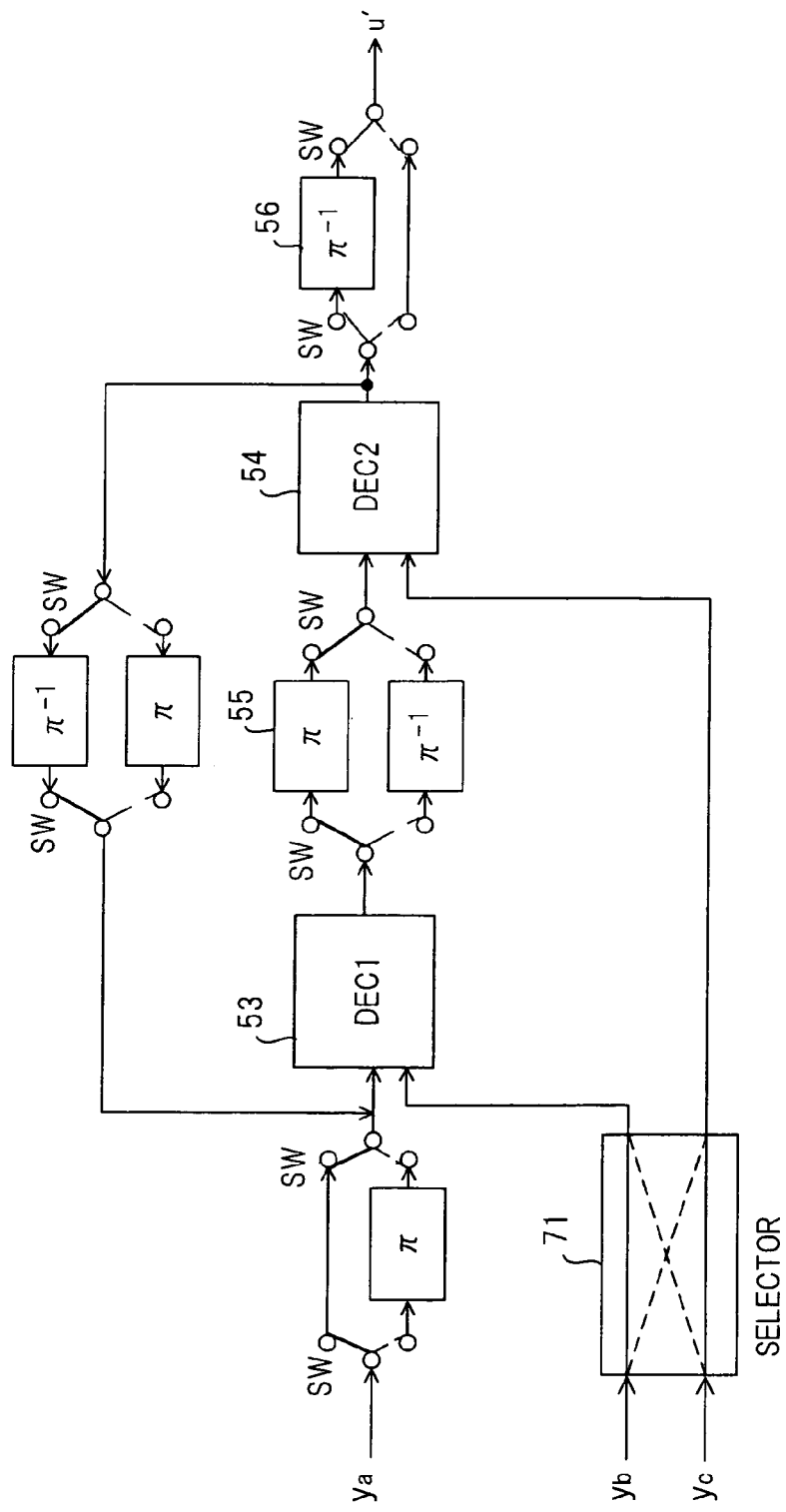
FIG. 12 is a diagram showing a modification (an arrangement in which the order of yb, yc input to DEC1, DEC2 is made reversible) of the fourth embodiment of the present invention.

FIG. 12 is a first modification of the fourth embodiment. Here the order of the received signals yb, yc input to the first and second elementary decoders 53, 54 can be changed by a signal selection circuit 71. In FIG. 12, $\pi$ represents interleavers, $\pi^{-1}$ represent deinterleavers and SW denote switches.

In order to obtain effects similar to those of the fourth embodiment with the modification of FIG. 12, the switches are used to switch between output (burst) of results of decoding directly from the second elementary decoder 54 and output (random) following deinterleaving, depending upon the nature of the output results of decoding (i.e., depending upon whether the pattern of error generation is bursty or random).

In a case where the results of decoding are output upon being deinterleaved, all of the switches SW are switched to the upper side (to the positions indicated by the solid lines). Further, the signal selection circuit 71 inputs the received signal yb to the first elementary decoder 53 and inputs the received signal yc to the second elementary decoder 54. Since deinterleaving is performed last under these conditions, any errors left in the decoded data are dispersed and output as random errors.

On the other hand, in a case where the output of the elementary decoder 54 is delivered as is, all of the switches SW are switched to the lower side (to the positions indicated by the dashed lines). Further, the signal selection circuit 71 inputs the received signal yc to the first elementary decoder 53 and inputs the received signal yb to the second elementary decoder 54. Furthermore, the received signal ya is input to the first elementary decoder 53 upon being interleaved. Under these conditions, the data is deinterleaved to restore the data to the original order before it is input to the second elementary decoder 54. The output of the second elementary decoder 54 therefore can be delivered directly as u'. The result is that if errors remain in the decoded data, these errors are made bursty errors.

(h) OTHER MODIFICATION OF FOURTH EMBODIMENT

Figure 13:
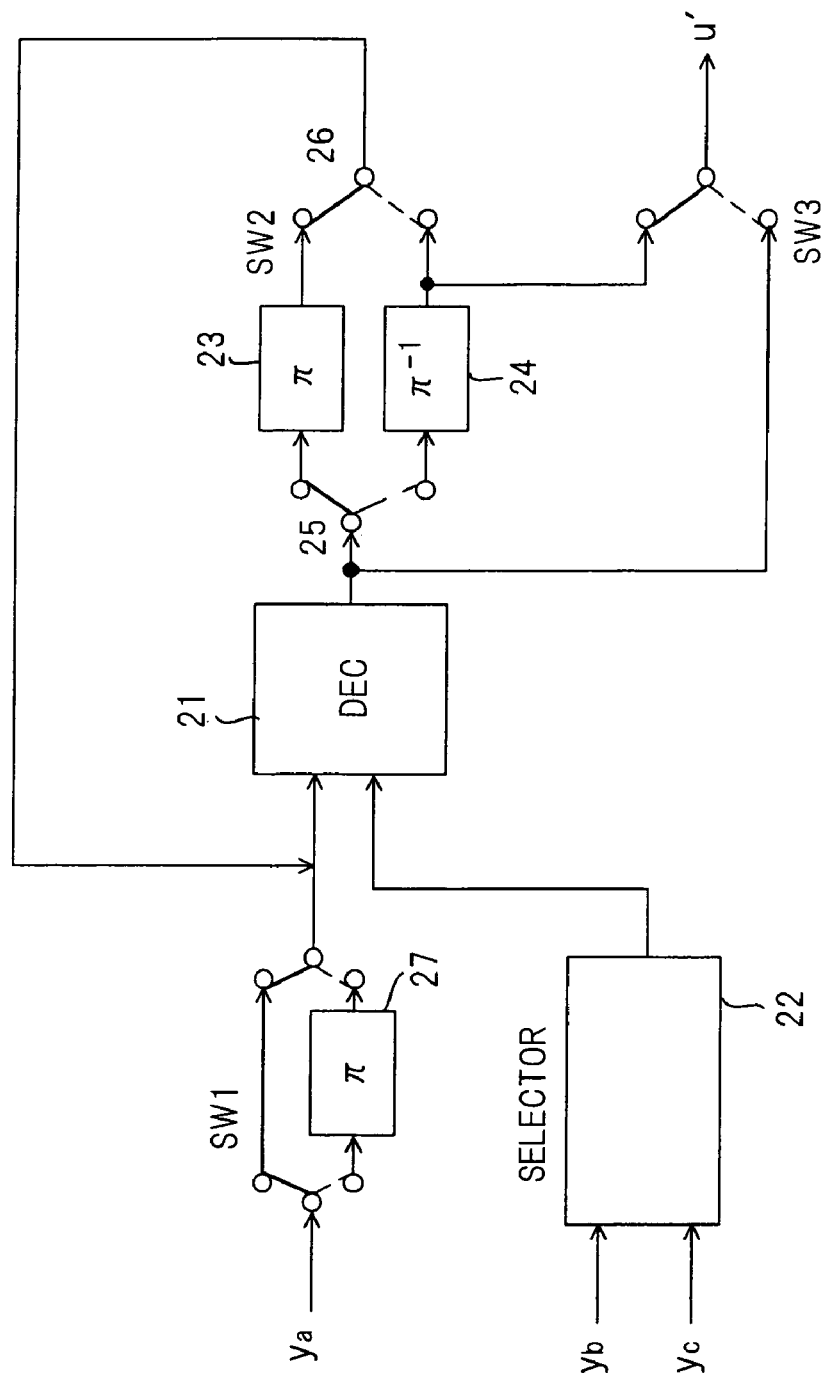
FIG. 13 is a diagram showing another modification (an arrangement in which use is made of a common elementary decoder) of the fourth embodiment of the present invention.
Figure 14:
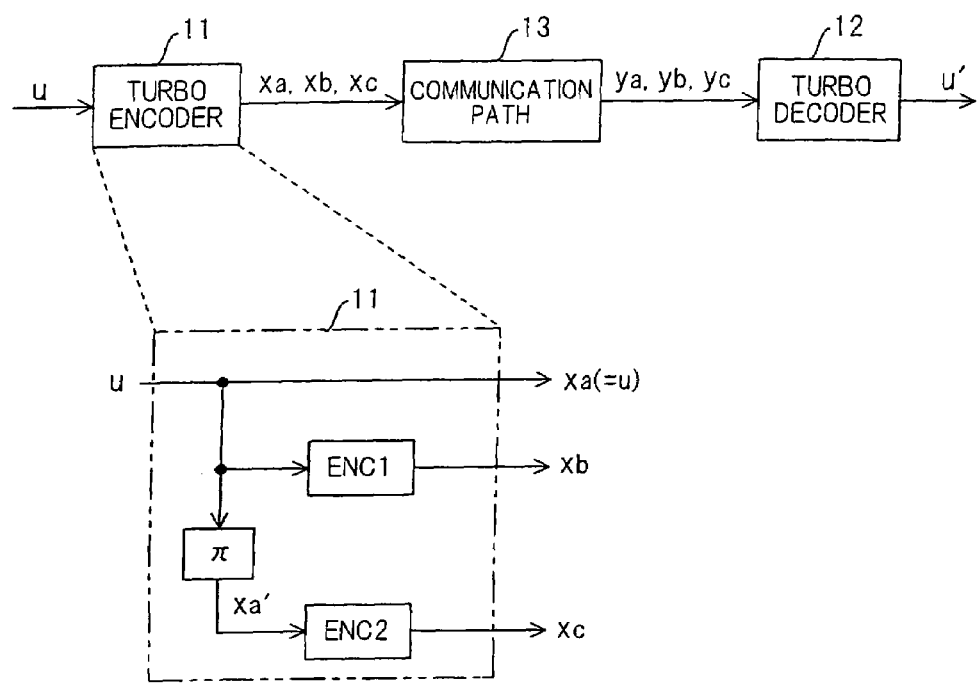
FIG. 14 is a schematic view of a communication system.
Figure 15:
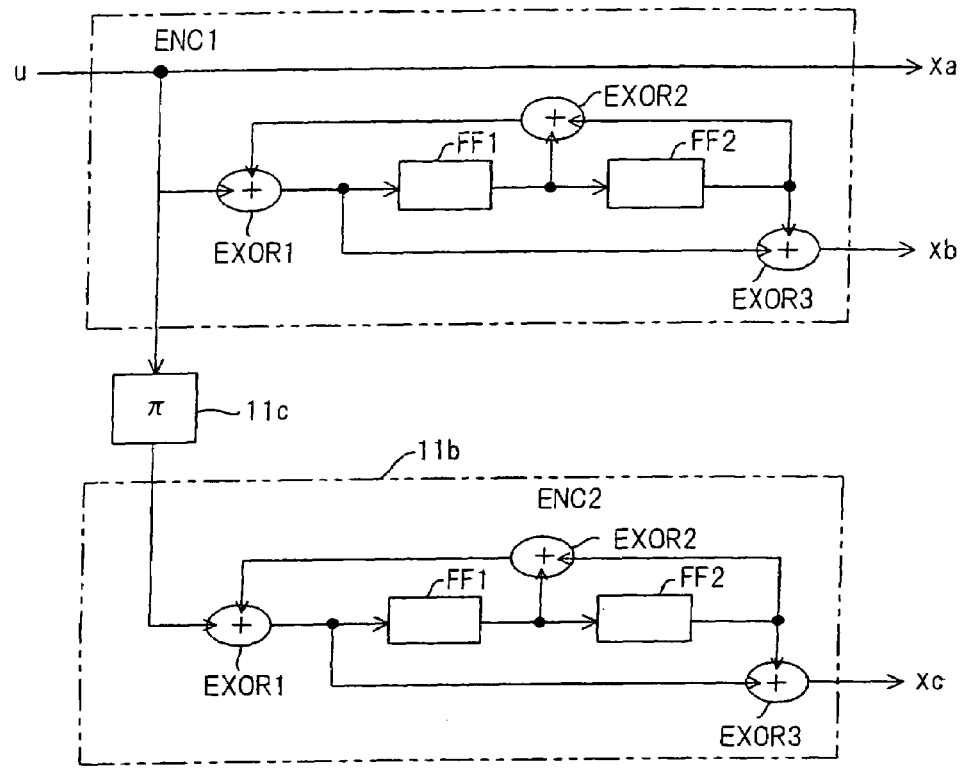
FIG. 15 is a block diagram of a turbo decoder.
Figure 16:
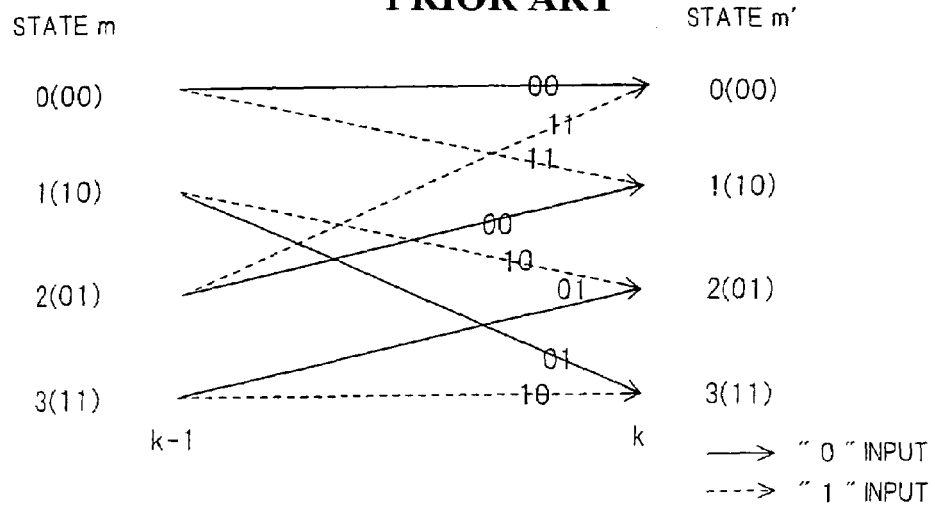
FIG. 16 is a diagram showing transitions in the state of a convolutional encoder.
Figure 17:
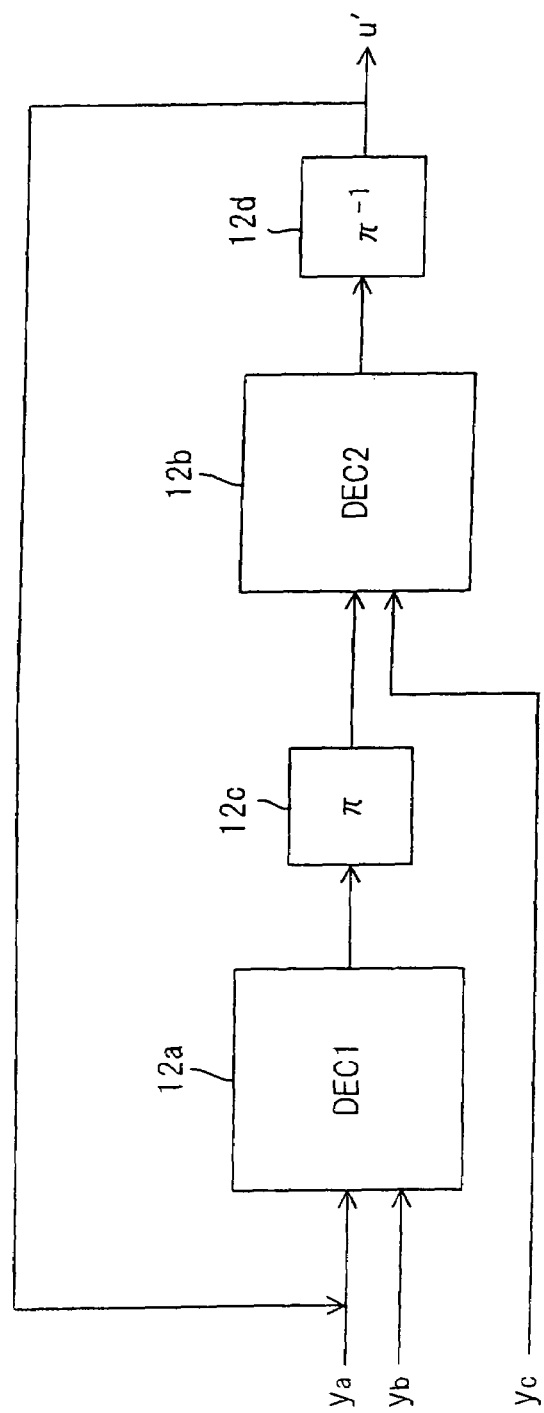
FIG. 17 is a block diagram of a turbo decoder.

FIG. 13 shows another modification of the fourth embodiment, in which components identical with those of FIGS. 3 and 6 are designated by like reference characters. This modification allows the single elementary decoder 21 to execute the decoding processing that was executed by the first and second elementary decoders, allows changeover between the arrangements of FIGS. 3 and 6 (the signal-extraction positions of which differ) using switches, and makes it possible to change the order of the received signals yb, yc input to the elementary decoder 21, whereby the pattern of error generation contained in the results of decoding is rendered bursty or random in appropriate fashion.

The data input from the selection circuit 22 to the elementary decoder 21 first may be either the received signal yb or the received signal yc. In case of the received signal yb, a switch SW1 used for when the received signal ya is input is switched to the upper side; in the case where the received signal yc is input, the switch SW1 is switched to the lower side. Whenever decoding is repeated, the selection circuit 22 switches the input to the elementary decoder 21 alternately between the received signal yb and the received signal yc. Further, output of the elementary decoder 21 in the case where the received signal yb has been input to the elementary decoder 21 is interleaved and fed back by switching a switch SW2 to the upper side. On the other hand, output of the elementary decoder 21 in the case where the received signal yc has been input to the elementary decoder 21 is deinterleaved and output by switching the switch SW2 to the lower side.

A switch SW3 is changed over in the following manner: If the input to the elementary decoder 21 is the received signal yb, the switch SW3 is switched to the lower side to deliver the output. If errors remain in the decoded results u' at this time, the errors become bursty errors. If the input to the elementary decoder 21 is the received signal yc, the switch SW3 is switched to the upper side to deliver the output. If errors remain in the decoded results u' at this time, the errors are randomized.

Overall operation will now be described.

In order to render the error generation pattern in results of decoding bursty, each switch is placed in the state indicated by the solid lines in the drawing (the state shown in FIG. 3). Under these conditions, the selection circuit 22 inputs the received signal yb to the elementary decoder 21 at the first timing. The elementary decoder 21 performs the MAP decoding operation using the received signals ya, yb, thereby outputting the likelihood of the results of decoding. The interleaver 23 interleaves the likelihood output from the elementary decoder 21 and feeds back the results to the input of the elementary decoder 21. Next, when the second timing arrives, the selection circuit 22 inputs the received signal yc to the elementary decoder 21 and the switches 25, 26 are changed over to the states indicated by the dashed lines in the drawings. The elementary decoder 21 performs the MAP decoding operation using the first half of the results of decoding (likelihood) and the received signal yc, thereby outputting the likelihood of the results of decoding. The deinterleaver ($\pi^{-1}$) 24 deinterleaves the likelihood output from the elementary decoder 21 and feeds back the results to the elementary decoder 21. If the results of decoding are extracted and output from the elementary decoder 21 at the first timing, the error generation pattern in these results of decoding will be bursty.

In a case where the error generation pattern in the results of decoding is to be randomized, each switch is placed in the state indicated by the dashed lines in the drawing (the state shown in FIG. 6). Under these conditions, the selection circuit 22 inputs the received signal yc to the elementary decoder 21 at the first timing. The elementary decoder 21 performs the MAP decoding operation using the interleaved received signal ya and the received signal yc, thereby outputting the likelihood of the results of decoding. The deinterleaver 24 deinterleaves the likelihood output from the elementary decoder 21 and feeds back the results to the input of the elementary decoder 21. Next, when the second timing arrives, the selection circuit 22 inputs the received signal yb to the elementary decoder 21 and the switches 25, 26 are changed over to the states indicated by the solid lines in the drawings.

The elementary decoder 21 performs the MAP decoding operation using the first half of the results of decoding (likelihood) and the received signal yb, thereby outputting the likelihood of the results of decoding. The interleaver 23 interleaves the likelihood output from the elementary decoder 21 and feeds back the results to the elementary decoder 21. If the results of decoding are extracted and output from the deinterleaver 24 at the first timing, the error generation pattern in these results of decoding will be random.

Thus, even if the turbo decoder employs a single elementary decoder, the generation of an error pattern in decoded data can be made bursty or random. In this case, one elementary decoder can be used as two elementary decoders, as a result of which the scale of the circuitry can be reduced.

Thus, in accordance with the present invention, detection of errors in the results of turbo decoding is performed while decoding is being repeated. If absence of errors is detected, the results of decoding are output even though repetition of the decoding operation is in progress; further decoding is discontinued. As a result, decoding time can be shortened and the power consumed by the circuitry can be reduced.

Further, in accordance with the present invention, it is so arranged that the number of times errors are detected in decoded results when decoding has been performed a set number of times is monitored and the decoding operation is executed again if the number of error detections is equal to or less than a set value. As a result, the decoding operation is performed one more time in instances where even though errors remain at the end of the set number of decoding operations, the number of errors is small and there is the possibility that all errors will be corrected if decoding processing is executed one more time. This makes it possible to output results of decoding in a state in which all errors have been corrected.

Further, in accordance with the present invention, it is so arranged that first and second decoding processes that were executed by first and second element decoders in the prior art are caused to be executed by a single elementary decoder, received signals used in each of the decoding processes are selected in conformity with the timings at which the first and second decoding processes are executed, and the selected signals are input to the elementary decoder. As a result, hardware can be reduced and so can power consumption.

Further, in accordance with the present invention, in a turbo decoder having two, namely first and second, elementary decoders, it is so arranged that a received signal input to the first elementary decoder and a received signal input to the second elementary decoder have their order reversed with respect to the prior art so that the pattern of generated error contained in a decoded signal is made bursty. As a result, error rate on a per-information-block basis can be reduced and so can the number of resends.

Further, in accordance with the present invention, it is so arranged that first and second decoding processes that were executed by first and second element decoders in the prior art are caused to be executed by a single elementary decoder, and the order of a received signal input to the elementary decoder at the time of the first decoding process and a received signal input to the elementary decoder and the time of the second decoding process is reversed with respect to the prior art. As a result, the amount of hardware can be reduced, error rate on a per-information-block basis can be reduced and so can the number of resends.

Further, in accordance with the present invention, it is so arranged that one of first and second decoded results output from first and second elementary decoders that construct a turbo decoder is selected appropriately and output. As a result, the generation of an error pattern in decoded data can be made bursty or random as necessary. Further, the first and second elementary decoders can be made a single common elementary decoder and, moreover, the generation of an error pattern in decoded data can be made bursty or random as necessary.

What is claimed is:

1. A turbo decoder for iteratively decoding received signals up to set number of times comprising:
    first and second elementary decoders for executing first decoding processing using a received signal, then executing second decoding processing using interleaved results of the first decoding processing and also using another received signal, and subsequently executing repeatedly, first decoding processing using deinterleaved results of the second decoding processing and also using said received signal and second decoding processing using interleaved results of the first decoding processing and also using said other received signal;
    an error detector for detecting errors in results of the first decoding processing in parallel with a decoding operation of the second decoding processing; and
    a controller which, when absence of error has been detected in results of the first decoding processing, is operable for outputting the results of the first decoding processing and halting the decoding operation of the second decoding processing even if the number of times decoding has been performed has not attained said set number of times.

2. A turbo decoder according to claim 1, wherein said error detector detects errors in results of the first decoding processing while the second decoding processing is being executed.

3. A turbo decoder according to claim 1, further comprising:
    a memory for storing the results of the first decoding processing; and
    means for outputting the results of the first decoding processing stored in said memory in accordance with the result of the error detection.

4. The turbo decoder according to claim 1, wherein said memory stores the results of the first and second decoding processing alternately.

5. The turbo decoder according to claim 1, wherein a signal obtained by interleaving the results of the first decoding processing is used for the second decoding processing.

6. A turbo decoder for iteratively decoding received signals up to a set number of times comprising:
    first and second elementary decoders for executing first decoding processing using a received signal, then executing second decoding processing using interleaved results of the first decoding processing and also using another received signal, and subsequently executing repeatedly, first decoding processing using deinterleaved results of the second decoding processing and also using said received signal and second decoding processing using interleaved results of the first decoding processing and also using said other received signal;
    an error detector for detecting errors in results of decoding in parallel with a decoding operation; and
    a controller which, when absence of error has been detected, is operable for outputting results of decoding and halting the decoding operation even if the number of times decoding has been performed is not a set number of times,
    wherein said controller monitors the number of times errors are detected in decoded results after decoding has been performed said set number of times and executes the decoding operation further if the number of times errors are detected is equal to or less than a set value.

7. A turbo decoder for receiving first data ya, second data yb obtained by encoding said first data, and third data yc obtained by interleaving and then encoding said first data, and executing decoding processing repeatedly using these received signals, comprising:
    first and second elementary decoders for executing first decoding processing using interleaved result of received signal ya and also using received signal yc, then executing second decoding processing using deinterleaved results of the first decoding processing and also using received signal yb, and subsequently executing, repeatedly, first decoding processing using interleaved results of the second decoding processing and also using said received signal yc, and second decoding processing using deinterleaved results of the first decoding processing and also using said received signal yb;
    an interleaving unit for interleaving the received signal ya and the results of the second decoding processing and inputting the same to the first elementary decoder; and
    a deinterleaving unit for deinterleaving the results of the first decoding processing and inputting the same to the second elementary decoder;
    wherein in order to render an error pattern in decoded bursty data, results of final decoding processing are output from said second elementary decoder directly without intervention of interleaving or deinterleaving.

8. A turbo decoder for receiving first data ya, second data yb obtained by encoding said first data, and third data yc obtained by interleaving and then encoding said first data, and executing decoding processing repeatedly using these received signals, comprising:
    one elementary decoder for executing first decoding processing using an interleaved result of received signal ya and also using received signal yc, then executing second decoding processing using deinterleaved results of the first decoding processing and also using received signal yb, and subsequently executing, repeatedly, first decoding processing using interleaved results of the second decoding processing and also using said received signal yc; and second decoding processing using deinterleaved results of the first decoding processing and also using said received signal yb;

an interleaving unit for interleaving the received signal ya and inputting the same to the elementary decoder;

a selection circuit for selecting the signal yc when the first decoding processing is executed, selecting the signal yb when the second decoding processing is executed, and inputting the selected signal to the elementary decoder; and means for deinterleaving results of the first decoding processing, interleaving results of the second decoding processing and inputting the deinterleaved and interleaved results to the elementary decoder, wherein results of decoding are output front said elementary decoder directly without intervention of interleaving or deinterleaving.

9. A turbo decoder for iteratively decoding received signals up to a set number of times, comprising:

first and second elementary decoders for executing first decoding processing using a received signal, then executing second decoding processing using interleaved results of the first decoding processing and also using another received signal, and subsequently executing, repeatedly, first decoding processing using deinterleaved results of the second decoding processing and also using said received signal, and second decoding processing using interleaved results of first decoding processing and also using said other received signal;

an interleaving unit for interleaving the results of the first decoding processing and inputting the same to the second elementary decoder;

a deinterleaving unit for deinterleaving the results of the second decoding processing and inputting the same to the first elementary decoder; and a selection circuit for selecting and outputting the results of first and second decoding processing output from said first and second elementary decoders based upon which of a bursty error pattern and a random error pattern is requested in decoded data;

wherein the nature of an error generation pattern in decoded data finally output is controlled by selecting the decoded data to be output.

10. A turbo decoder for iteratively decoding received signals up to a set number of times comprising:

first and second elementary decoders for executing first decoding processing using a received signal, then executing second decoding processing using interleaved or deinterleaved results of the first decoding processing and also using another received signal, and subsequently executing repeatedly, first decoding processing using deinterleaved or interleaved results of the second decoding processing and also using said received signal and second decoding processing using interleaved or deinterleaved results of the first decoding processing and also using said other received signal;

a first interleaving unit and a first deinterleaving unit for respectively interleaving and deinterleaving the results of the first decoding processing and inputting the same to the second elementary decoder;

a second deinterleaving unit and a second interleaving unit for respectively deinterleaving and interleaving the results of the second decoding processing and inputting the same to the first elementary decoder;

a first selection circuit for selecting a combination of received signals input to the first elementary decoder that executes said first decoding processing and selecting a received signal input to the second elementary decoder that executes the second decoding processing based upon which of a bursty error pattern and a random error pattern is requested in decoded data;

a second selection circuit for selecting the interleaved results of the first interleaving unit and the deinterleaved results of the first deinterleaving unit and inputting the same to the second elementary decoder based upon which of a bursty error pattern and a random error pattern is requested in decoded data; and a third selection circuit for selecting the deinterleaved results of the second deinterleaved unit and the interleaved results of the second interleaving unit and inputting the same to the second elementary decoder based upon which of a bursty error pattern and a random error pattern is requested in decoded data;

wherein the nature of an error generation pattern in decoded data is controlled by switching the received signals and switching the interleaved results and the deinterleaved results input to the first and second elementary decoders.

11. A turbo decoder for receiving first data ya, second data yb obtained by encoding said first data, and third data yc obtained by interleaving and then encoding said first data, and executing decoding processing repeatedly using these received signals, comprising:

an elementary decoder for executing first decoding processing using interleaved results of received signal yc, then executing second decoding processing using deinterleaved results of the first decoding processing and also using said received signal yb, and subsequently executing repeatedly, first decoding processing using interleaved results of the second decoding processing and also using said received signal yc; and second decoding processing using deinterleaved results of the first decoding processing and also using said received signal yb; and an interleaving unit for interleaving the received signal ya and inputting the same to the first elementary decoder;

an interleaving unit and a deinterleaving unit for respectively interleaving and deinterleaving the results of the second and first decoding processing and inputting the same to the elementary decoder;

a first selection circuit for selecting a combination of received signals input to the elementary decoder at a dining at which said first decoding processing is executed, and selecting a received signal input to the elementary decoder at a timing at which said second decoding processing is executed; and a second selection circuit for selecting the interleaved results of the interleaving unit and the deinterleaved results of the deinterleaving unit at timings of said second and first decoding processing and inputting the same to the elementary decoder;

wherein the nature of an error generation pattern in decoded data is controlled by switching the received signals and switching the interleaved results and the deinterleaved results input to the elementary decoder at the timings of the first and second decoding processing.

* * * * *